US 8,188,911 B2

(12) United States Patent
Beasley

(10) Patent No.: US 8,188,911 B2
(45) Date of Patent: May 29, 2012

(54) LOW NOISE GENERATOR FOR FREQUENCY SWEPT SIGNALS

(75) Inventor: Patrick David Lawrence Beasley, Malvern (GB)

(73) Assignee: Qinetiq Limited, London (GB)

( * ) Notice: Subject to any disclaimer, the term of this patent is extended or adjusted under 35 U.S.C. 154(b) by 337 days.

(21) Appl. No.: 12/524,070

(22) PCT Filed: Jan. 31, 2008

(86) PCT No.: PCT/GB2008/000306
§ 371 (c)(1),
(2), (4) Date: Jul. 22, 2009

(87) PCT Pub. No.: WO2008/093077
PCT Pub. Date: Aug. 7, 2008

(65) Prior Publication Data
US 2010/0090886 A1  Apr. 15, 2010

(30) Foreign Application Priority Data
Jan. 31, 2007 (GB) .................................. 0701812.0

(51) Int. Cl.
*G01S 7/282* (2006.01)
(52) U.S. Cl. ............ 342/200; 342/202; 342/84; 342/99; 342/100; 342/128; 342/194
(58) Field of Classification Search .......... 342/200–204, 342/84, 98–100, 128, 194, 195
See application file for complete search history.

(56) References Cited

U.S. PATENT DOCUMENTS

| 3,170,158 | A | | 2/1965 | Rotman |
| 4,121,221 | A | | 10/1978 | Meadows |
| 5,184,093 | A | | 2/1993 | Itoh et al. |
| 5,675,345 | A | | 10/1997 | Pozgay et al. |
| 6,069,580 | A | * | 5/2000 | Martinson ........................ 342/20 |
| 6,114,987 | A | * | 9/2000 | Bjornholt ....................... 342/200 |
| 6,373,344 | B1 | * | 4/2002 | Mar ................................ 331/96 |
| 6,407,697 | B1 | | 6/2002 | Hager et al. |
| 6,449,317 | B1 | * | 9/2002 | Critchlow et al. ............ 375/308 |
| 6,496,545 | B1 | | 12/2002 | Liu |

(Continued)

FOREIGN PATENT DOCUMENTS
EP  1 560 335 A2  8/2005
(Continued)

OTHER PUBLICATIONS

Pappenfus et al., "Single Sideband Principles and Circuits," *Single Sideband Principles and Circuits*, XP-002358761, Jan. 1, 1964, pp. 32-39.

(Continued)

*Primary Examiner* — John B Sotomayor
(74) *Attorney, Agent, or Firm* — Oliff & Berridge, PLC

(57) ABSTRACT

A signal generation system suitable for use in a radar system comprises a local oscillator (LO) and an intermediate frequency (IF) oscillator, wherein the IF oscillator is a Direct Digital Synthesizer (DDS), and the LO is a free running oscillator not itself locked to another oscillator but which acts as a clock reference for the DDS and is the highest frequency oscillator in the system. The LO may also act as a reference for a receive chain digitizer. The invention exploits phase noise advantages of a free running oscillator at some distance from the carrier whilst maintaining coherency with other system components. The system typically finds application in FMCW radars.

15 Claims, 6 Drawing Sheets

U.S. PATENT DOCUMENTS

| | | | |
|---|---|---|---|
| 6,686,867 B1 | 2/2004 | Lissel et al. | |
| 7,002,511 B1 * | 2/2006 | Ammar et al. | 342/134 |
| 7,023,374 B2 * | 4/2006 | Jossef et al. | 342/20 |
| 7,079,596 B1 | 7/2006 | Namura | |
| 7,876,164 B2 * | 1/2011 | Imenes et al. | 331/25 |
| 7,952,516 B2 * | 5/2011 | Atherton | 342/200 |
| 8,077,075 B2 * | 12/2011 | Randler et al. | 342/70 |
| 8,077,076 B2 * | 12/2011 | Walter et al. | 342/70 |
| 2002/0145475 A1 * | 10/2002 | Fenton et al. | 331/25 |
| 2003/0042988 A1 | 3/2003 | Nagasaku et al. | |
| 2004/0130482 A1 | 7/2004 | Lin et al. | |
| 2006/0044182 A1 | 3/2006 | Vacanti | |
| 2007/0067123 A1 * | 3/2007 | Jungerman | 702/67 |

FOREIGN PATENT DOCUMENTS

| | | |
|---|---|---|
| GB | 2 088 168 A | 6/1982 |
| GB | 2 116 795 A | 9/1983 |
| GB | 2 305 781 A | 4/1997 |
| GB | 2 373 113 A | 9/2002 |
| WO | WO 91/08615 A1 | 6/1991 |
| WO | WO 99/27385 A1 | 6/1999 |
| WO | WO 2006/103391 A1 | 10/2006 |

OTHER PUBLICATIONS

Beasley, "The Influence of Transmitter Phase Noise on FMCW Radar Performance," *Proceedings of the 3$^{rd}$ European Radar Conference*, Sep. 2006, pp. 331-334.

Beasley et al., "Solving the Problems of a Single Antenna Frequency Modulated CW Radar," *IEEE International Radar Conference*, May 1990, pp. 391-395.

Mayer et al., "Eight-Channel 77-GHz Front-End Module With High-Performance Synthesized Signal Generator for FM-CW Sensor Applications," *IEEE Transactions on Microwave Theory and Techniques*, vol. 52, No. 3, Mar. 2004, pp. 993-1000.

Simon, Peter S., "Analysis and Synthesis of Rotman Lenses," 22$^{nd}$ AIAA International Communication Satellite Systems Conference & Exhibit 2004, pp. 1-11, American Institute of Aeronautics and Astronautics, Inc.

Mayock et al. "A Wideband Millimeter-wave Front-End for Automotive Radar," IEEE, 1999, pp. 1501-1504.

\* cited by examiner

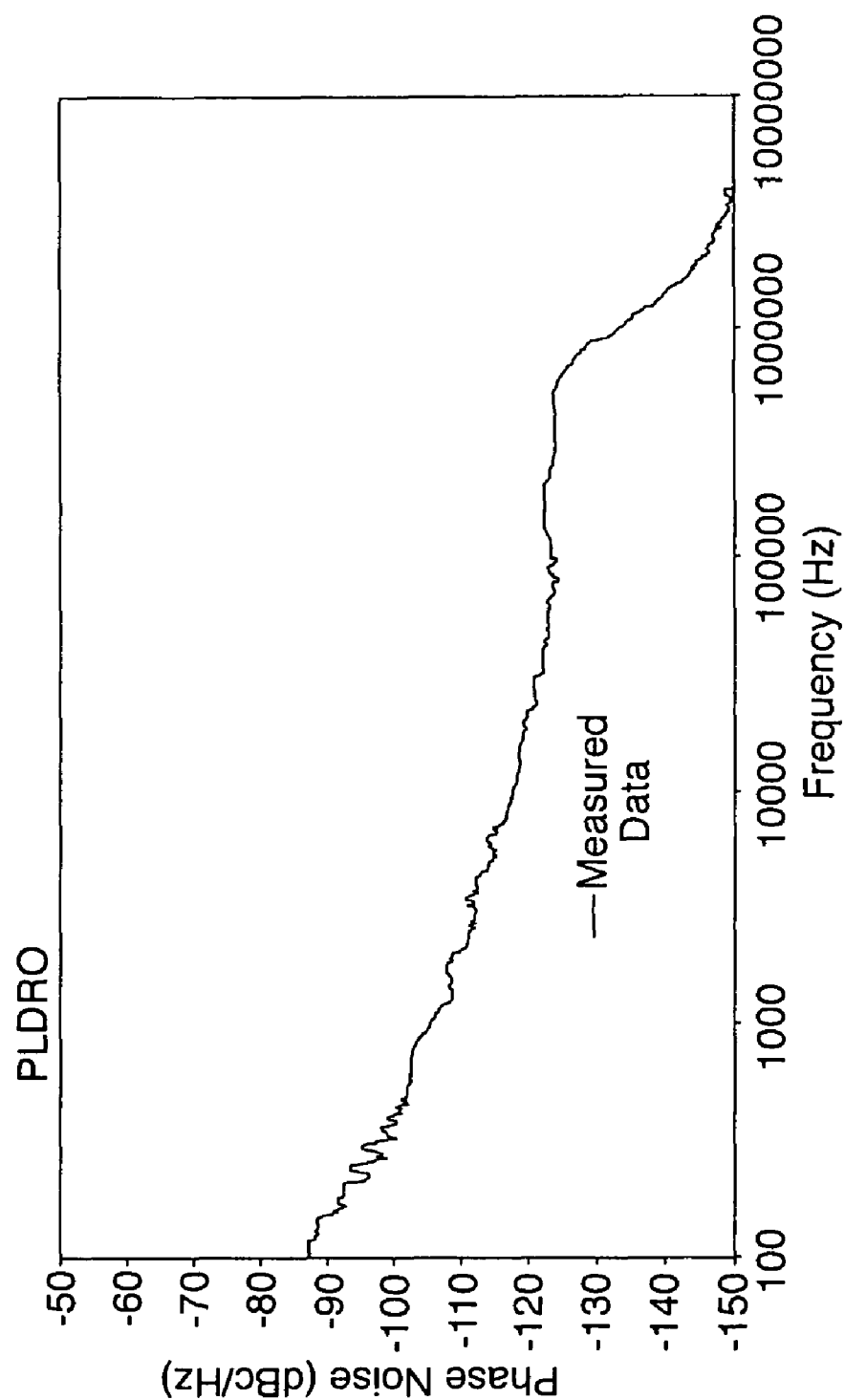

LOW NOISE GENERATOR FOR FREQUENCY SWEPT SIGNALS

This invention relates to signal generation systems, such as may typically be used in radar systems. In particular, it relates to radar systems, particularly FMCW (Frequency Modulation Continuous Wave) radar systems, where it is advantageous to keep phase noise generated in key system components as low as practically and financially possible to achieve an improved operational performance.

FMCW radar systems are characterised by having both the transmit and receive functions active simultaneously. This can lead to problems not encountered in more traditional pulse radars, wherein signals can "leak" from the transmitter to the receiver, usually via the respective antennas, making it harder to detect received signals from a target because of the energy coming directly from the transmitter. This problem is ameliorated by designing the transmit and receive antennas and related subsystems such that there is greater isolation between the two.

A related problem can occur due to large, usually static objects such as buildings, being positioned within range of a radar. The radar return from such an object may be large, and so can result in a similar effect to that of leakage directly between the transmit and receive antennas. As well as producing large returns in given range cells corresponding to the distance between the object and the radar, the presence of large objects can increase the overall noise levels across most or all of the range cells. This can be clearly seen in FIG. 4 of "*The Influence of Transmitter Phase Noise on FMCW Radar Performance*", by Beasley, P. D. L, 3$^{rd}$ European Radar Conference, EuRAD 2006, pp 331-334, the whole contents of which are hereby included by reference. This may be compensated to a degree by post processing, but as the underlying cause of the problem is still present, this is not an ideal solution. For example, one way around the problem of increased noise is to raise the detection threshold, generally using constant false alarm rate (CFAR) algorithm. This will reduce the number of false alarms, but of course also reduces the detection capabilities of the system. Another solution is to turn off the radar when it is pointing in the direction of a large static object, but this has obvious disadvantages in terms of system availability.

Most FMCW radar systems transmit a signal that comprises a series of frequency sweeps. For these systems, a key factor influencing the performance of the radar is the phase noise of the transmitted signal. A system having lower phase noise will typically suffer less from the above problems than one suffering from a greater phase noise.

A simplified prior art FMCW architecture is shown at FIG. 1. A Local oscillator (LO) 1 is connected to a first input of up-convert mixer 3. An intermediate frequency (IF) signal generator 2 provides a second input to the mixer 3. The IF signal generator 2 is typically a voltage controlled oscillator, in which the output frequency is controlled by a voltage level on an input. The output of mixer 3 is amplified in amplifier 4, the output of which feeds a transmit antenna (not shown). The output frequency of IF signal generator 2 is controlled by a ramp generator 5, that is locked to a reference clock 6. The reference clock 6 also connects to the local oscillator 1, acting as its frequency reference. The local oscillator 1 and the reference clock 6 are typically arranged in a phase locked loop circuit (not shown), to provide a convenient means of locking the two oscillators together.

A receive antenna (not shown) receives, amongst other signals, reflections of the transmitted signal from targets. These signals are amplified in amplifier 7, and then fed into an input of receive mixer 8. A second input to mixer 8 is taken from the output of transmit mixer 3. The output of mixer 8 is an IF signal which is digitised in analogue to digital converter 9, this producing a digital signal which is processed in a conventional manner in signal processor 10.

This arrangement provides a coherent transmit signal, as the ramp generation is locked to the local oscillator frequency. However, phase noise on the output of the LO can cause the problems mentioned above and lead to a desensitisation of the radar. Typically, much of the phase noise arises from the clock reference 6, as any phase noise present on its output signal is multiplied up in the local oscillator 1 by the ratio $f_{LO}/f_{REF}$, where $f_{LO}$ is the frequency of the LO and $f_{REF}$ is the frequency of the reference oscillator.

Another prior art FMCW radar system is described in "*Solving the Problems of a Single Antenna Frequency Modulated CW Radar*", by P. D. L. Beasley, A. G. Stove, and B. J. Reits, IEE International Radar Conference, Virginia, May 1990. This describes a method for improving the performance of a single antenna radar by implementation of a reflected power canceller.

A further prior art FMCW radar system is described in "*Eight-Channel 77-GHz Front-End Module With High-Performance Synthesized Signal Generator for FM-CW Sensor Applications*" by Winfried Mayer, Martin Meilchen, Wilfried Grabherr, Peter Nüchter, and Rainer Gühl According to the present invention there is provided a signal generation system comprising at least a local oscillator and an Intermediate Frequency (IF) signal generator utilising a direct digital synthesiser, characterised in that the local oscillator is a free running oscillator not itself controlled by a further reference oscillator, is the highest frequency oscillator in the system, and which is adapted to be a reference source for a clock signal for the IF signal generator.

A signal generation system according to the present invention is able to produce signals suitable for transmission by an FMCW radar that have good phase noise performance at least one frequency offset from a carrier. This is achieved by use of the local oscillator acting as the reference for other system components, and by the use of a DDS. For many radar applications the phase noise performance close in to the main carrier is of lesser importance than the performance further out. For example, the phase noise performance at an offset from the carrier of beyond 200 KHz, 500 kHz or 1 MHz, may be much more critical to overall system performance (depending upon the application to which the system is put) than offsets closer to the carrier. Local oscillators such as DROs that are locked to a lower frequency reference in, for example, a phase locked loop arrangement as disclosed in prior art documents can provide excellent close-in phase noise figures, but tend to become significantly worse than a free-running DRO further out from the carrier.

Embodiments of the invention employing the architecture disclosed herein can give advantages when the system is used to produce the output signal used in an FMCW radar system in that the maximum range may be increased. Prior art systems sometimes attempt to improve range by increasing the transmitted power, but this approach has diminishing returns due to coupling effects between the transmit and receive antennas. Phase noise coupled into the receive chain from the transmit chain will tend to increase linearly with the transmitted power, and at some point will start to dominate the thermal noise normally present in the receiver. When this occurs increasing the transmitted power is detrimental to the system's performance. As the present invention will result in reduced noise across most or all range bins then the sensitivity to signals across substantially the full range will improve, meaning that the radar is able to detect objects having a smaller radar cross sectional area. Thus, particular embodiments of the present invention allow an increased transmit power to be used before the deleterious effects mentioned above come into play. The improved sensitivity can also be used to increase the range of the system for a given transmit power, should this be desirable in a particular system.

The signal generation system according to the present invention may extend not only to signals in a transmit path of the radar, but also to signals in a receive part. Advantageously a receiver signal path is adapted to be coherent with signals in a transmit path. Advantageously a frequency down conversion means in the radar receive path is arranged to have an input derived from the local oscillator.

Advantageously a frequency up conversion means in a transmit path is a quadrature up-conversion mixer and is arranged to have a first input from the local oscillator, and second inputs from the IF signal generator, the second inputs being in-phase (I) and quadrature (Q) inputs. This allows a simplified filtering arrangement to be implemented, as the mixer will itself suppress unwanted sidebands usually produced in a non-quadrature single mixer.

Advantageously a digitisation system, such as an analogue to digital converter (ADC), in a receive chain of the radar is also locked to the local oscillator. Locking the IF signal generator and the receiver ADC to the local oscillator produces coherent system operation. Any clock jitter generated in the local oscillator will also be present in the IF system and the ADC, thus giving coherency throughout the system.

A system according to the present invention may employ a frequency multiplier to produce a signal having a frequency substantially higher than that produced by the FRO. Thus embodiments of the invention may be employed in radars systems where the required transmit frequency band is substantially higher than the output frequency of the FRO. A frequency multiplier may be arranged to take as its input the output of the FRO, or an amplified version thereof. Alternatively, a frequency multiplier may be arranged to take as its input a modulated output from an up-converter mixer. As a frequency multiplier functions essentially by multiplying a voltage at its input with itself, it does not need to be in a feedback loop with the FRO, and so the problems identified with respect to the prior art and its increased close-in phase noise are avoided.

A radar system that is adapted to operate in a coherent manner according to embodiments of the present invention has advantages over a non coherent system.

Firstly, it allows the radar to perform coherent integration of received signals. When signals are received from a target from a plurality of frequency sweeps, usually known as hits, then these signals may be integrated to improve the signal strength. In a non coherent system the improvement is proportional to the square root of the number of hits, whereas for a coherent system according to the present invention the improvement will be proportional instead to the number of hits. This is of particular benefit for slower scanned radar systems where a larger number of hits per dwell on a target are performed.

Secondly, a coherent system allows the radar to perform better in bad weather conditions. Rain is a cause of problems in many radar systems due to the increased backscatter of the transmitted signal. As rain is an essentially random media, it causes returns that have the property of thermal noise, and all returns from it are incoherent. Thus, multiple returns from it will integrate to produce a signal proportional to the square root of the number of hits, whereas targets will integrate as described above to produce a signal proportional to the number of hits.

Thirdly, a coherent system improves the radar's ability to do simultaneous range-Doppler processing. This increases the radar's ability to track targets, as the coherency can provide additional parameters into a tracking filter such as a Kalman filter. It also allows range-Doppler coupling ambiguities normally found in FMCW systems to be eliminated.

An embodiment of the invention may comprise a signal generation system suitable for a radar comprising a free running oscillator (FRO) for generating an LO signal, and a DDS that has an input clock derived from an output of the FRO, where the FRO is the highest frequency oscillator in the system, and where an output of the DDS is used to modulate the LO signal.

The FRO is thus not directly dependent upon any other oscillator in the system in the maintenance of its output frequency. In particular, the FRO is not phase or frequency locked to any other oscillator in the system An embodiment of the invention may also incorporate an analogue to digital converter (ADC) in a receive chain of a radar, wherein the ADC has a clock signal derived from the FRO.

The derivation of the clock or clocks for any of the DDS and the ADC may be carried out using a frequency divider. Alternatively, any other suitable method for deriving a clock signal for the DDS or the ADC that maintains coherency with the input clock from the FRO may be used.

An embodiment of the present invention may comprise a radar system comprising a free running oscillator (FRO) for generating an LO signal, and a DDS that has an input clock derived from an output of the FRO, where the FRO is the highest frequency oscillator in the system, and where an output of the DDS is used to modulate the LO signal.

Another aspect of the invention comprises a method of processing signals within a radar system comprising the steps of:
  i. arranging a free running oscillator (FRO) to provide a transmit local oscillator signal, wherein the FRO is the highest frequency oscillator in the system;
  ii. deriving a reference clock for an IF oscillator from an output of the FRO, wherein the IF oscillator is a direct digital synthesiser (DDS);
  iii. producing a transmit signal by mixing a signal derived from the output of the FRO with a signal derived from the output of the DDS.

Thus the method described is able to generate a radar transmit signal that has a modulation generated by the DDS that is coherent with the local oscillator signal.

The method may include the additional step of incorporating an analogue to digital converter (ADC) in a receive chain of the radar, the ADC having a clock reference derived from an output of the FRO.

The invention will now be described in more detail, by way of example only, with reference to the following Figures, of which:

Figure 1:
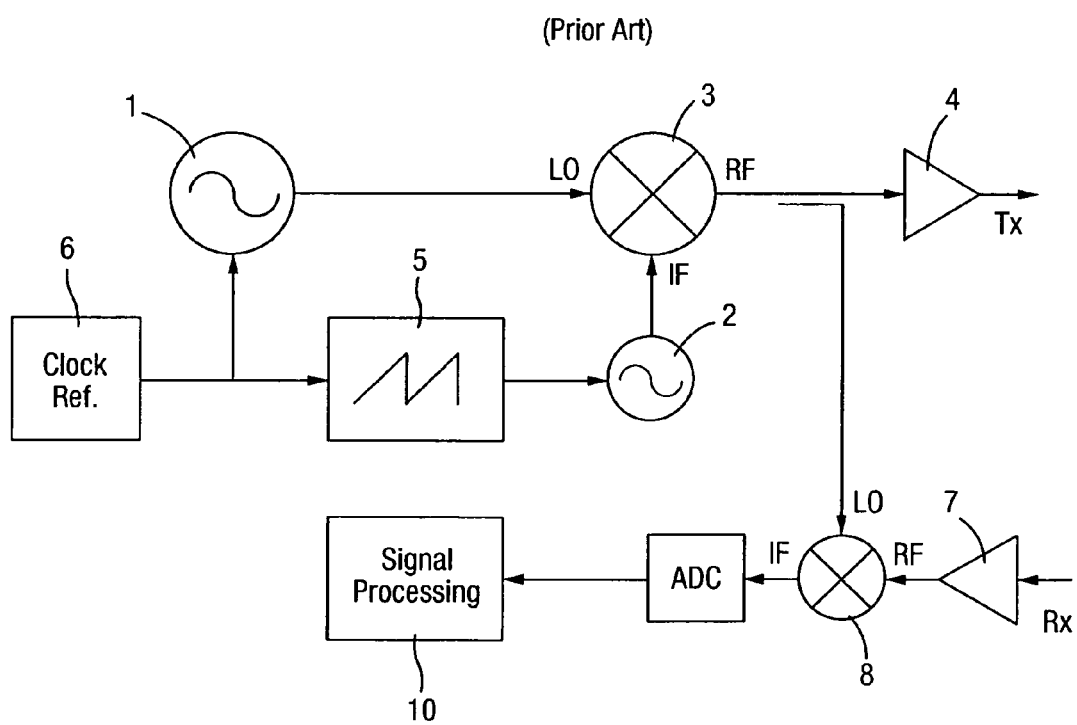
FIG. 1 shows a simplified block diagram of a prior art FMCW radar system.
Figure 2:
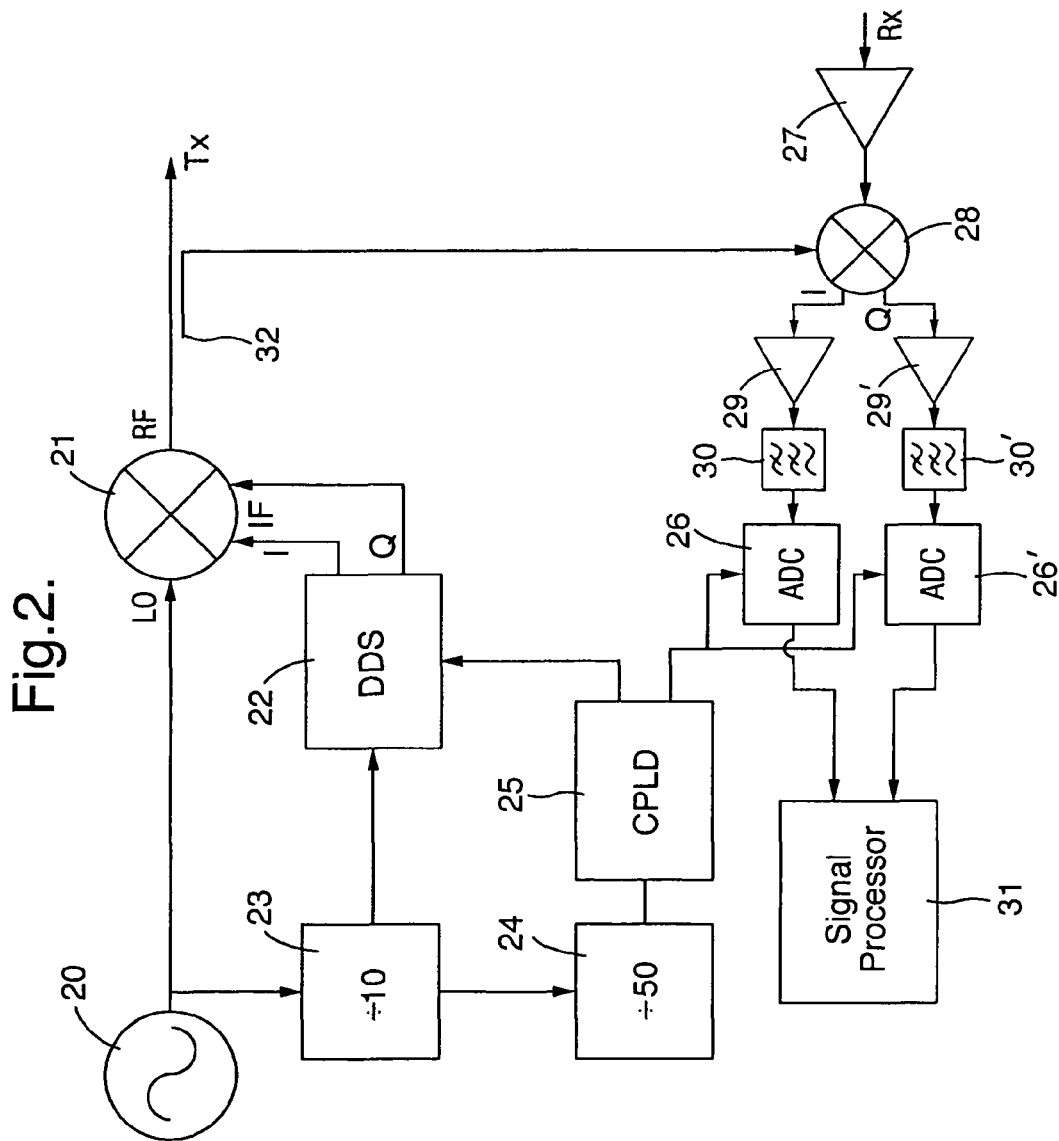
FIG. 2 shows a block diagram illustrating a first embodiment of the present invention.

FIG. 2 shows a first embodiment of the present invention. The figure shows a part of a simplified block diagram for an FMCW radar system. An FRO acting as the local oscillator (LO) 20 operative at 9.2 GHz provides an input to a quadrature up-convert mixer 21. A second input to the mixer 21 comes from an IF oscillator in the form of a direct digital synthesiser (DDS) device 22, in this case implemented using a pair of Analog Devices AD9858 DDS chips. As well as providing an input to mixer 21, the output of the LO 20 also feeds a first frequency divider 23, which in turn drives a second frequency divider 24. An output from the first frequency divider 23 is used as a reference clock source for the direct digital synthesiser 22. The second frequency divider 24 provides a clock reference source to a complex programmable logic device (CPLD) 25, which has outputs connected to both the DDS and to analogue to digital converters (ADC) 26, 26' that are used to digitise incoming signals reflected from targets and other objects.

The embodiment has a receiver chain comprising a low noise amplifier 27, a mixer 28 having both In phase (I) and Quadrature (Q) outputs coupled to a pair of IF amplifiers 29, 29', then to a pair of Nyquist filters 30, 30', defining a pair of channels. The outputs of the Nyquist filters 30, 30' feed ADCs 26, 26' each of which provides digital signals to signal processing means 31. Mixer 28 has a second input taken from the signal to be transmitted.

Transmit mixer 21 is a quadrature up-convert mixer fed at the IF input with both an I and Q input from DDS 22. Use of the up-convert mixer 21 greatly simplifies the filtering requirements at its output. This is true also of the receive mixer 28. Known phase cancellation techniques implemented within these mixers enable a given sideband (i.e. upper or lower sideband) to be output, whilst suppressing the other, unwanted sideband. This is simply done in each case by allowing the I channel to lead the Q channel by 90° for one sideband, and to lag it by 90° for the other.

A benefit of using a DDS to generate an in-phase and quadrature IF signal is that it may be used to correct for known imperfections in the mixer 21. It is common for there to be small gain and phase errors in quadrature up convert mixers that lead to an incomplete cancellation of the unwanted sideband. The flexibility of a DDS allows phase errors to be reduced by adjusting the relative phase of the DDS I and Q outputs. Thus the I and Q outputs of the DDS may be adjusted to have a phase difference of $90°+\delta$, where $\delta$ is chosen to correct a known error in the mixer 21. Output amplitudes may be similarly adjusted using known techniques to correct for known gain errors in the mixer 21.

The local oscillator 20 is, in the embodiment described above, a stable local oscillator (STALO) based upon the principles of the dielectric resonant oscillator (DRO). As the STALO is not itself locked to a reference frequency source (as it acts as the reference source for the IF oscillator and ADC), and therefore is not part of a phase locked loop circuit, it is a free running DRO (FRDRO). Oscillators utilizing the DRO principle of operation are often used when a low phase noise output is required, although typically in prior art applications they will be locked to a lower frequency reference in some way, for example in a phase locked loop circuit.

In operation, the FRDRO produces a 9.2 GHz LO output which feeds one input of mixer 21. The DDS is clocked by a reference clock signal derived from the LO output, but divided in frequency from it by a quotient of 10. The output frequency of the DDS 22 is determined by this clock in combination with the input from the CPLD 25. The clock input to the CPLD is taken from the frequency divider 24 having a division quotient of 50, which is itself supplied from frequency divider 23. Thus the clock frequency supplying the ADC is 18 MHz. The CPLD 25 contains logic that triggers the DDS to start its frequency sweep, causing the DDS output to ramp linearly between 200 MHz and 250 MHz in a repetitive fashion. This output frequency is mixed with an output of the STALO 20 in mixer 21, to produce the output signal of the radar, of 9.4 GHz to 9.45 GHz. As both the DDS and the CPLD are locked, via dividers 23 and 24, to the STALO 20, the output signals of the CPLD 25 and the DDS 22 are all coherent with the STALO 20 output. The CPLD may also be used to reprogram the DDS to change its frequency sweep parameters should such frequency agility be desired.

Advantageously the DDS may be clocked at as high a frequency as possible, as this tends to result in reduced noise being present in signals at the output of the DDS.

Received signals comprising, amongst other things, reflections from targets enter the system via a receive antenna (not shown), and are amplified in low noise amplifier 27. The amplified signal is then mixed with a signal simultaneously being transmitted by the transmitter, by splitting off some of the energy in the final stages of the transmit path, using directional coupler 32.

The output of mixer 28 is an I-Q pair comprising the difference frequency between the received signal and the signal simultaneously being transmitted. The signals are amplified in amplifiers 29, 29', filtered in low pass filters 30, 30' before being digitised using analogue to digital converters 26, 26'. The digitisers are driven by a clock signal from the CPLD, which as described above is itself driven from a clock derived from the STALO. Thus the digitisation is synchronous with the other system elements, and the FRO effectively acts as a clock reference for all coherency critical components in the system.

The resulting digital signals may then be processed as required, for example using conventional FMCW processing techniques known to those skilled in the art.

It will be understood by those normally skilled in the art that the choice of frequency sweep parameters will depend upon the application for which the radar is being used. The present invention is particularly versatile in this respect due to the use of a DDS to generate the frequency sweep. The sweep parameters, such as sweep rate, and start and stop frequencies, may conveniently be varied by a straightforward reprogramming of the DDS.

The output of the DDS is, in this embodiment, an I-Q pair, as discussed above, with selection of the upper or lower sideband being determined by the phase relationship of the I and Q channel outputs. One side band is selected at the output of the quadrature up-convert mixer should I lead Q in phase, and the other side band is selected should Q lead I. The actual sideband chosen in each case depends upon the details of the connection to the mixer. The versatility of the DDS coupled with this characteristic of the quadrature up-convert mixer allows for a nominal doubling of the output range of frequencies from the DDS, should this be desirable for a given application. This may be done by effectively generating the full frequency sweep in two halves.

Figure 3A:
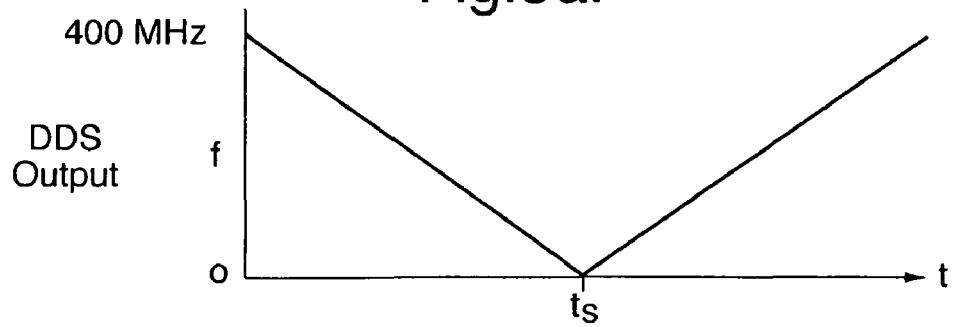
FIG. 3 shows a graph of DDS output characteristics, and a resultant quadrature up-converter output.
Figure 3B:
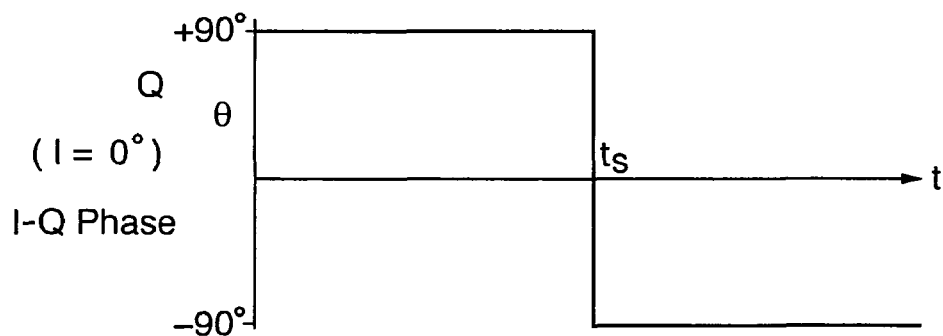

This is illustrated in FIG. 3. FIG. 3a shows a graph of a DDS output frequency and FIG. 3b shows the relative phase of the I and Q channels. The DDS is programmed to generate a frequency sweep starting at a start frequency $F_s$ of 400 MHz, going linearly to zero Hz at time $t_s$ and then linearly back to stop frequency $F_p$ of 400 MHz. The Q channel is set to lead the I channel up to time $t_s$, and to lag the I channel after time $t_s$, as shown in FIG. 3b. To get a positive frequency slope at the mixer output the connection to the mixer should be made in this instance as described such that when Q leads I the lower sideband is selected. A negative frequency slope may be provided by reversal of the I-Q phase relationship described above.

Figure 3C:
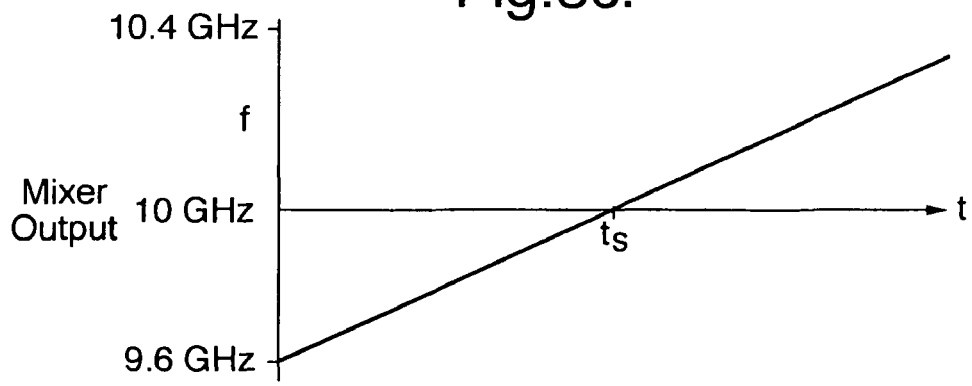

The resultant output of the mixer is shown in FIG. 3c, where a frequency sweep of 800 MHz has been generated.

Of course, certain embodiments of the present invention may comprise a DDS having a single (i.e. non I-Q) output, should this be sufficient for the application for which it is used. A person normally skilled in the art would appreciate the various advantages and disadvantages of making such a change to the system for a particular application.

Figure 4:
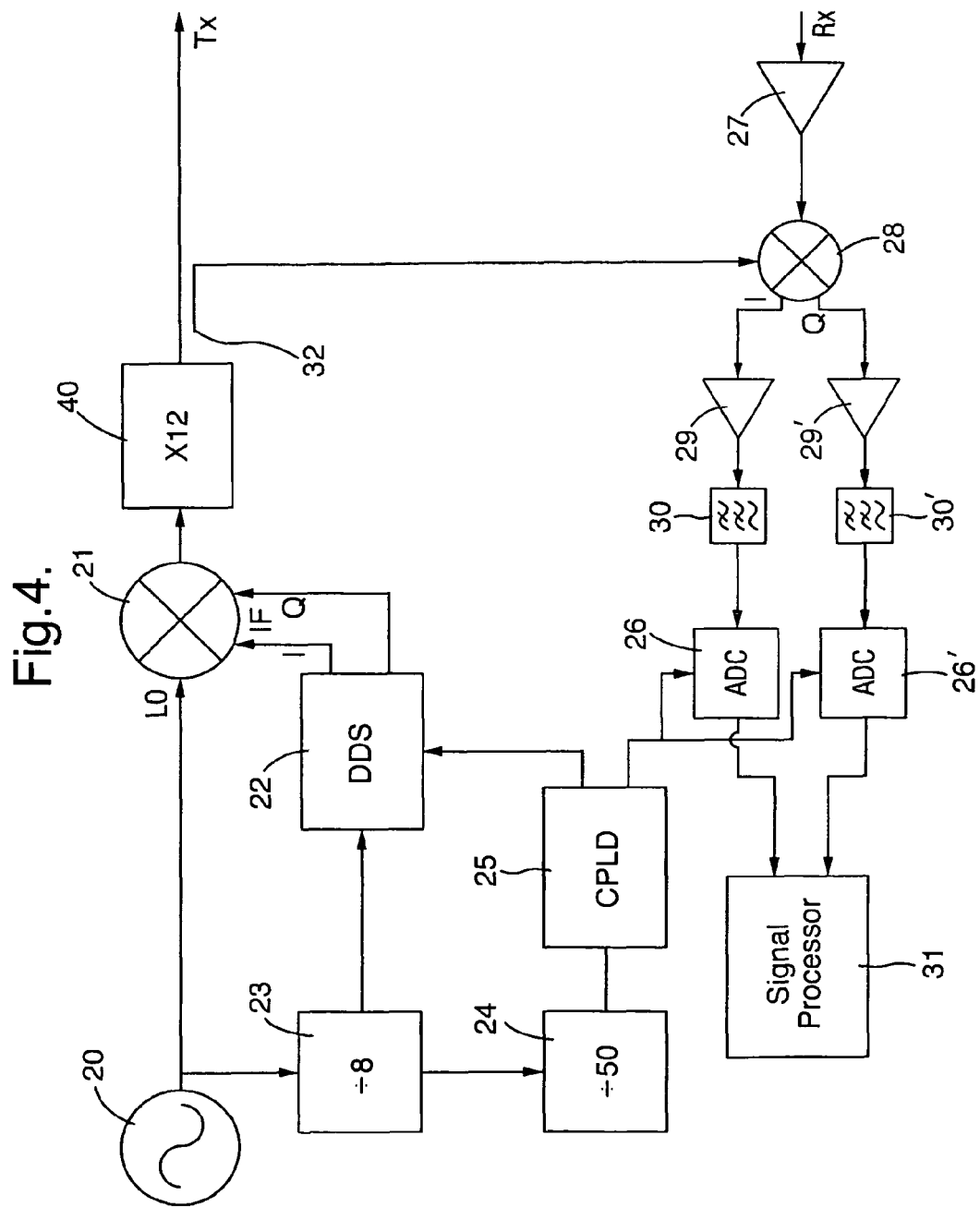
FIG. 4 shows a block diagram illustrating a second embodiment of the present invention.

FIG. 4 shows a second embodiment of the present invention. This is similar in principle to the first embodiment, but is adapted to produce a much higher output frequency. Components functionally equivalent to those of the first embodiment are therefore given the same reference numbers.

The basic operation is in many ways identical to that of the first embodiment described in relation to FIG. 2. The description of this embodiment will therefore concentrate on those parts that are different to the first embodiment.

Local oscillator 20, operational at 7.78 GHz is connected to a first input of mixer 21. A second input signal to the mixer 21 is provided by DDS 22. A reference clock signal supplied to the DDS 22 is derived from the output of the LO 20, after having been divided down in frequency by a factor 8, using frequency divider 23. A control signal, for setting the output frequency of the DDS is generated in CPLD 25. DDS 22 is arranged to supply a linear ramp signal to the mixer 21 within the frequency range 70 MHz to 120 MHz. The CPLD 25 is itself driven by a clock signal derived ultimately from the LO 20, but having been divided by divider 23, and then by divider 24. Divider 24 divides by factor 50 to supply a clock to the CPLD of frequency 18 MHz. The CPLD 25 also provides a clock reference to ADC 26, which is used to digitise received signals.

The output of mixer 21 goes to frequency multiplier 40, which provides as an output a signal twelve times the frequency of its input. The frequency multiplier 40 uses standard non-linear techniques to generate its output, thus avoiding use of further high frequency oscillators, which are more susceptible to phase noise generation. The highest frequency oscillator in both the transmit and receive chain, up to the digitisation stage, is therefore the LO 20, which acts as a frequency reference for the DDS 22 and ADCs 26, 26'.

Figure 5B:
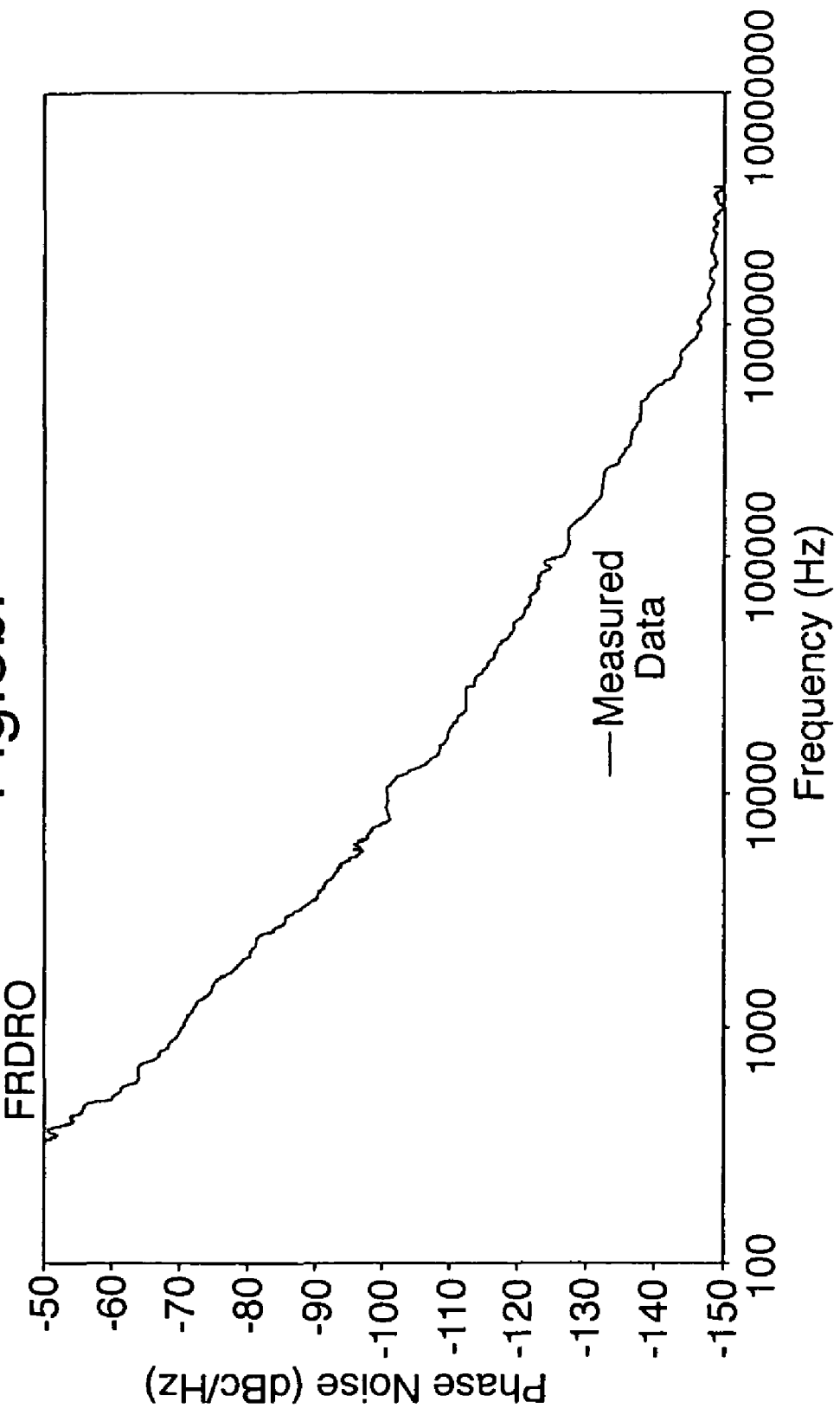
FIG. 5 illustrates relative performance in terms of phase noise for a free running DRO and a similar DRO integrated into a phase locking circuit.

FIG. 5 shows a graph of phase noise levels typical of both a phase locked high frequency DRO (PLDRO), and a FRDRO over an offset frequency range of ~300 Hz to 10 MHz. Plot A is the measured phase noise of a PLDRO supplied by Nexyn and running at 11.2 GHz, whilst plot B is that for a similar DRO but instead operating as a FRDRO. It can be seen that, at the lower offset frequencies the PLL output is significantly lower in phase noise, due to the filtering action of the PLL circuit loop filter. From approximately 100 KHz however, the FRDRO overtakes the PLL oscillator in phase noise performance as the uncompensated instabilities of the PLL circuit are propagated through to the higher frequency oscillator. For many systems the noise at the lower frequency end of the scale is not so critical to system performance. This is because, in a radar system, received signals will emanate from objects at some distance from the radar antennas. This means that the time of flight from the transmit antenna to the object and back will be relatively long. This time of flight defines the frequency at the output of mixer 28 (of FIGS. 2 and 4) due to the frequency swept nature of the signal transmitted. Therefore, by suitable choice of the sweep parameters the frequencies of interest at the receiver can be pushed into the lower phase noise region of FIG. 4 where the FRDRO performs more effectively.

The invention thus provides, for many applications, a means to obtain improved performance over more traditional PLL based radar systems. One application of the radar is in the field of very high resolution radar systems, such as those used to detect small objects such as FOD on a runway, taxiway, or other safety critical area. The invention has applicability for radar systems operative at least in the microwave and millimeter wave regions, and has useful applicability from around 1 GHz up into the several hundreds of GHz region.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during the prosecution of this application or of any such further application derived there-from. In particular, with reference to the appended claims, features from dependent claims may be combined with those of the independent claims and features from respective independent claims may be combined in any appropriate manner and not merely in the specific combinations enumerated in the claims.

The invention claimed is:

1. A signal generation system for a high resolution coherent radar comprising at least a local oscillator (LO) and an Intermediate Frequency (IF) signal generator utilising a direct digital synthesiser (DDS), wherein the local oscillator is a free running oscillator not itself controlled by a further reference oscillator, is the highest frequency oscillator in the system, and which is adapted to be a reference source for a clock signal for the IF signal generator, and further wherein the local oscillator is operative in the microwave or millimeter wave regions.

2. A signal generation system as claimed in claim 1, wherein the local oscillator is a free running dielectric resonant oscillator.

3. A signal generation system as claimed in claim 1, wherein the radar is a frequency modulation continuous wave radar system.

4. A signal generation system as claimed in claim 1, wherein frequency down-conversion means is located in a receive chain of the radar and is arranged to reduce the frequency of a received signal using mixing means, the mixing means having an input derived from the local oscillator.

5. A signal generation system as claimed in claim 1, wherein a receive chain of the radar incorporates a digitisation system having a clock derived from an output of the local oscillator.

6. A signal generation system as claimed in claim 1, wherein a frequency mixer in a transmit path is adapted to receive the output from the local oscillator and the output from the IF signal generator to produce a mixer output signal.

7. A signal generation system as claimed in claim 6, wherein the system forms part of a radar, and further wherein the mixer output produces a signal to be transmitted by the radar.

8. A signal generation system as claimed in claim 6, wherein the system forms part of a radar, and further wherein a frequency multiplier is connected to the mixer, with an output of the frequency multiplier producing a signal to be transmitted by the radar.

9. A signal generation system as claimed in claim 6, wherein the mixer is a quadrature mixer, with inputs from the local oscillator and the IF signal generator, the IF signal generator being adapted to have an in-phase (I) and a quadrature (Q) output.

10. A signal generation system as claimed in claim 9, wherein the IF signal generator is adapted to generate an output signal starting at a frequency $F_s$, that sweeps linearly to zero Hz, and then sweeps linearly to a stop frequency $F_p$, wherein at the point of reaching zero Hz the DDS is adapted to swap the phase of the I channel with that of the Q channel.

11. A radar system incorporating a signal generation system as claimed in claim 1.

12. A system as claimed in claim 1, wherein the DDS is adapted to produce a signal comprising a frequency sweep.

13. A method of processing signals within a radar system comprising the steps of:
   i. arranging a free running oscillator (FRO) to provide a transmit local oscillator signal, the FRO being operative in the microwave or millimeter wave regions;
   ii. deriving a reference clock for an IF oscillator from an output of the FRO, wherein the IF oscillator is a direct digital synthesiser (DDS);
   iii. producing a transmit signal by mixing a signal derived from the output of the FRO with a signal derived from the output of the DDS.

14. A method as claimed in claim 13, wherein the method includes the additional step of incorporating an analogue to digital converter (ADC) in a receive chain of the radar, the ADC having a clock reference derived from an output of the FRO.

15. A signal generation system comprising at least a local oscillator (LO) and an Intermediate Frequency (IF) signal generator utilising a direct digital synthesiser (DDS), wherein the local oscillator is a free running oscillator not itself controlled by a further reference oscillator, is the highest frequency oscillator in the system, and which is adapted to be a reference source for a clock signal for the IF signal generator, and further wherein a quadrature frequency mixer in a transmit path is adapted to receive the output from the local oscillator and in-phase (I) and quadrature (Q) outputs from the IF signal generator to produce a mixer output signal, and further wherein the IF signal generator is adapted to generate an output signal starting at a frequency that sweeps linearly to zero, and then sweeps linearly to a stop frequency, wherein at the point of reaching zero the DDS is adapted to swap the phase of the I channel with that of the Q channel.

* * * * *